(12) United States Patent
Imai

(10) Patent No.: US 7,070,304 B2
(45) Date of Patent: Jul. 4, 2006

(54) LIGHT EMITTING DIODE

(75) Inventor: Sadato Imai, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 62 days.

(21) Appl. No.: 10/911,545

(22) Filed: Aug. 5, 2004

(65) Prior Publication Data
US 2005/0030752 A1 Feb. 10, 2005

(30) Foreign Application Priority Data
Aug. 7, 2003 (JP) .............................. 2003-206617

(51) Int. Cl.
*F21V 3/04* (2006.01)

(52) U.S. Cl. ...................... 362/267; 362/311; 362/800; 313/501; 313/512

(58) Field of Classification Search ................ 362/297, 362/346, 304, 267, 310, 800, 311, 307, 347, 362/350; 313/501, 512; 438/25; 257/98, 257/99, 100
See application file for complete search history.

(56) References Cited

U.S. PATENT DOCUMENTS

| | | | | |
|---|---|---|---|---|
| 5,894,196 | A * | 4/1999 | McDermott | 313/512 |
| 6,850,001 | B1 * | 2/2005 | Takekuma | 313/501 |
| 6,964,489 | B1 * | 11/2005 | Blume et al. | 362/27 |

FOREIGN PATENT DOCUMENTS

JP 2002-280614 9/2002

* cited by examiner

*Primary Examiner*—Thomas M. Sember
(74) *Attorney, Agent, or Firm*—Browdy and Neimark, PLLC

(57) ABSTRACT

A light emitting diode is provided which includes a circuit substrate, a semi-spherical concave surface part formed in the circuit substrate, and a transparent stage disposed in the semi-spherical concave surface part in the circuit substrate. An LED chip is mounted on the horizontal upper surface of the transparent stage, a reflective member forms a truncated cone-shaped concave surface part disposed to be joined to an end of the semi-spherical concave surface part and attached on the substrate. A sealing body is disposed in the joined concave surface parts to cover the LED chip. The transparent stage includes a lower surface having a convex surface corresponding to a concave surface of the semi-spherical concave surface part and an upper surface formed in a horizontal surface. The LED chip is mounted on the horizontal upper surface of the transparent stage.

6 Claims, 2 Drawing Sheets

LIGHT EMITTING DIODE

CROSS REFERENCE TO THE RELATED APPLICATION

The application claims the priority benefit of Japanese Patent Application No. 2003-206617, filed on Aug. 7, 2003, the entire description of which are incorporated herein by reference.

BACKGROUND OF THE INVENTION

1. Field of the Invention

The present invention relates to a light emitting diode used in a device such as a personal computer, printer, PDA, facsimile, pager, mobile phone or the like.

2. Description of Related Art

Recently, a liquid crystal display having a thin and visible backlight mechanism is widely used for various electrical devices of a mobile device and so on, such as a laptop personal computer, PDA, mobile phone or the like, on which light communication functions are loaded.

Conventionally, a surface-mounted light emitting diode provided for small and thin electronic devices has usually a structure in which a pair of electrodes are patterned on an upper surface of a glass epoxy substrate, an LED chip is fixed on the electrodes by a transparent adhesive, upper electrodes of the LED chip and the pair of electrodes on the substrate are wire-bonded, and a transparent resin is attached to the substrate to cover the LED chip.

The light emitting diode having such a structure has low usability of light, because it has no reflector part and light emitted from the LED chip radiates from a side surface of the transparent resin.

Therefore, a light emitting diode, in which the usability of light emitted from the LED chip is improved, is widely used, for example, as shown in Japanese Patent Laid-Open 2002-280614.

The light emitting diode 21 described in the patent document as described above has a structure in which an insulative substrate 24 is formed by insert molding of a white resin and silver-plating electrode patterns are disposed on the substrate 24, an LED chip 26 is fixed on the electrode patterns 22,23 by a transparent adhesive 25 and upper electrodes (not shown) of the LED chip 26 and the electrode patterns 22,23 are connected by bonding wires 27 comprising metal thin wires, and a reflective member 28 having a reflector part 28a which has an upward parabola shape is disposed on the insulative substrate 24 so as to surround the LED chip 26.

A transparent resin 29 is also disposed within the reflector part 28a to cover the LED chip 26.

The light emitting diode 21 structured as described above is surface-mounted on a printed substrate 19 by soldering 20.

The light from upper and side surfaces of the LED chip 26 is reflected on the reflector part 28a and emitted upwardly, however, there is a problem that light emitted from a lower surface of the LED chip 26 is blocked by the electrode patterns 22, 23 or the insulative substrate 24. As a result, the light emitted from the lower surface of the LED chip 26 cannot be used efficiently and the light loss of the LED chip 26 becomes large.

SUMMARY OF THE INVENTION

The present invention has been made in view of the above problem and an object thereof is to provide a light emitting diode configured to enhance usability of light from an LED chip.

To attain the above object, a light emitting diode according to an aspect of the present invention comprises a circuit substrate, a reflective member attached on the circuit substrate, a semi-spherical concave surface part formed in the circuit substrate, a truncated cone-shape concave surface part formed in the reflective member and disposed to continue to the semi-spherical concave surface part, a transparent stage disposed in the semi-spherical concave surface part of the circuit substrate, an LED chip mounted on the transparent stage, and a sealing body disposed in the semi-spherical concave surface part and the truncated cone-shape concave surface part to cover the LED chip.

One portion of light emitted from the LED chip is directed through the transparent sealing body toward outside thereof and another portion of light is reflected on the truncated cone-shape concave surface part, the reflected light is directed through the sealing body toward outside of the reflective member. On the other hand, light emitted from a lower portion of the LED chip is sent through the transparent stage and reflected on the semi-spherical concave surface and the reflected light is directed through the sealing body toward outside thereof. In this way, most of light emitted from the LED chip is reflected effectively on the semi-spherical concave surface part and the truncated cone-shape concave surface part and therefore it is possible to use light effectively.

DETAILED DESCRIPTION OF THE PREFERRED EMBODIMENTS

One embodiment of a light emitting diode according to the present invention will be explained with reference to the accompanying drawings.

Figure 1:
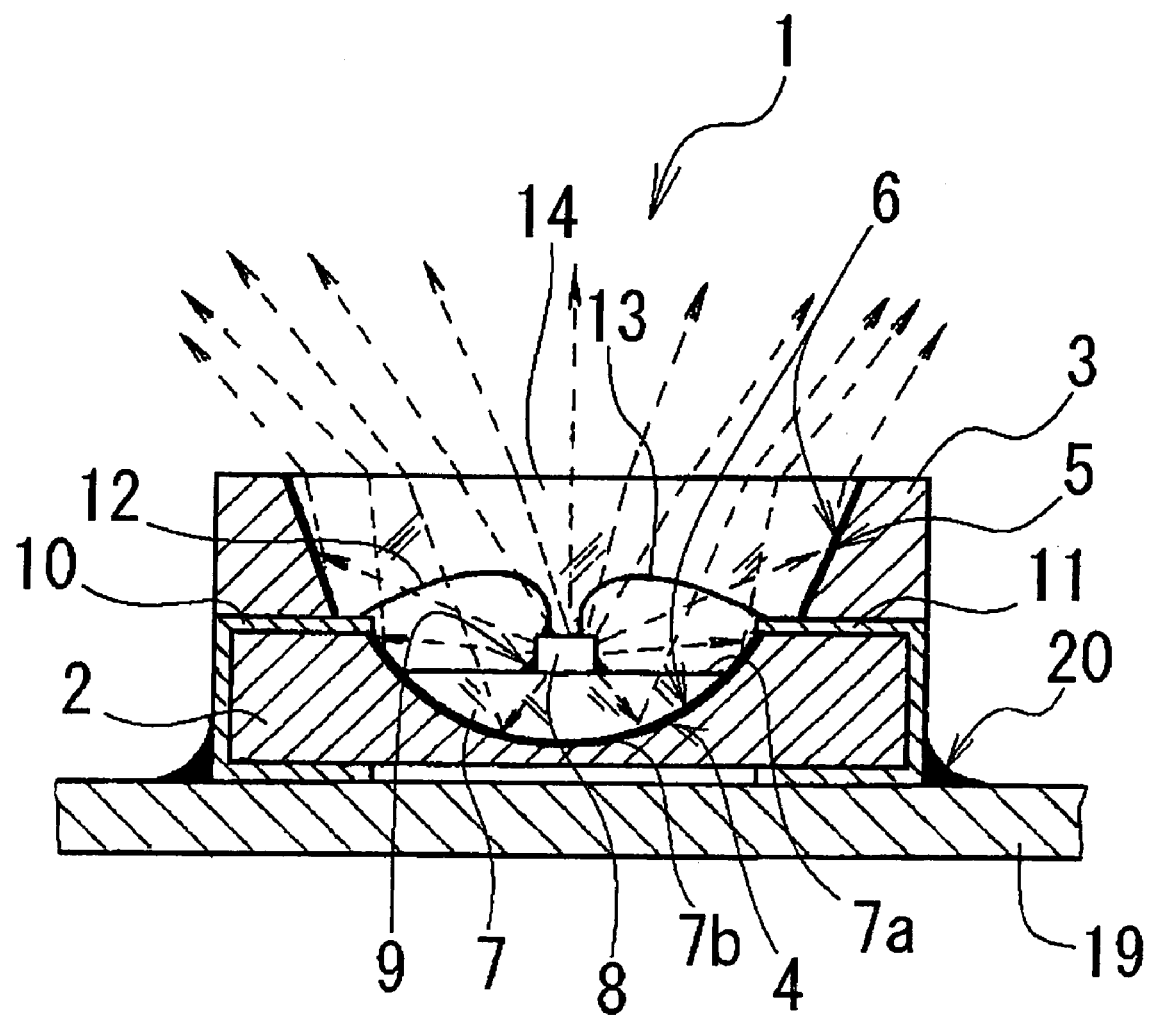
FIG. 1 is a sectional view showing one embodiment of a light emitting diode according to the present invention.
Figure 2:
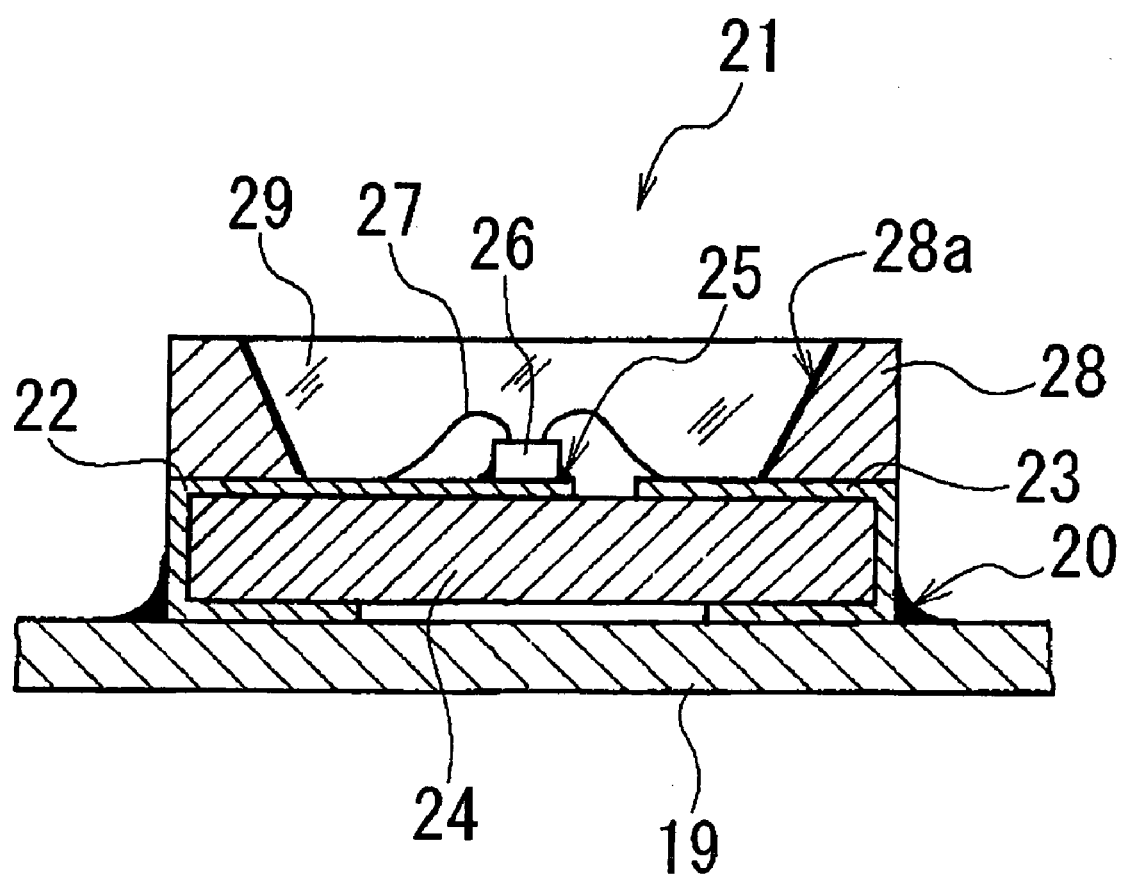
FIG. 2 is a sectional view of a conventional light emitting diode.

The light emitting diode 1 of the present invention is shown in FIG. 1. The light emitting diode 1 comprises a circuit substrate 2 and a reflective member 3 disposed on the circuit substrate 2 and fixed by an appropriate fixing means (not shown).

The circuit substrate 2 has at a generally central portion thereof a semi-spherical concave surface part 4 for reflecting light, and the reflective member 3 has a truncated cone-shape concave surface part 5 for reflecting light, disposed to join the end of the semi-spherical concave surface part 4 above the semi-spherical concave surface part.

A metal reflective film 6 is formed preferably on a surface of each of the semi-spherical concave surface part 4 and the truncated cone-shape concave surface part 5. The metal reflective film 6 comprises a film made of a metal such as silver, aluminum or the like which is easy to reflect light and is formed by, for example, evaporation.

Here, it should be noted that the surface of each of the semi-spherical and truncated cone-shape concave surface parts 4 and 5 may be formed into a mirror surface to reflect light.

A transparent stage 7 is disposed within the semi-spherical concave surface part 4 at approximately a central portion thereof. The stage 7 has an upper surface 7a formed into a horizontal surface and a lower surface 7b including a spherical surface corresponding to that of the semi-spherical concave surface part 4. In addition, the stage 7 is formed by means of pouring a liquid transparent resin into the semi-spherical concave surface part 4 and forming it into the above shape, or the stage 7 is previously formed and the formed stage is attached within the semi-spherical concave surface part 4.

An LED chip 8 is disposed on the upper surface 7a of the transparent stage 7 and is fixed thereto, for example, by a transparent adhesive 9. Here, it should be noted that when the LED chip 8 is disposed on the horizontal upper surface 7a of the stage 7, the LED chip 8 is preferably disposed on approximately the central portion of the semi-spherical concave surface part 4. This is because light from the LED chip 8 is directed uniformly toward the semi-spherical concave surface part 4, when the LED chip 8 is disposed on the approximately central portion of the semi-spherical concave surface part 4.

The LED chip 8 is connected with a pair of electrode patterns 10 and 11 provided on the circuit substrate 2 by means of wire bonding or wires 12 and 13.

After the LED chip 8 is fixed on the stage 7, a sealing body 14 is provided to cover the LED chip 8 and the wires 12 and 13. In the embodiment, a transparent resin material in liquid form is injected into the semi-spherical concave surface part 4 and the truncated cone-shape concave surface part 5 and is hardened to form the sealing body.

Meanwhile, the aforementioned light emitting diode 1 is surface-mounted on a printed substrate 19 by soldering 20.

An operation of the light emitting diode structured as described above will be explained below.

In FIG. 1, one portion of light emitted from an upper portion of the LED chip 8 is directed outside of the reflective member 3 through the transparent sealing body 14 and another portion of the light is reflected on the truncated cone-shape concave surface part 5, and the reflected light is directed outside of the reflective member 3 through the sealing body 14.

On the other hand, light emitted from a lower portion of the LED chip 8 is reflected on the semi-spherical concave surface part 4 through the transparent stage 7, and the reflected light is directed outside of the sealing body 14 through it.

More specifically, light from the upper surface of the LED chip 8 is reflected on the metal reflective film 6 through the transparent sealing body 14 and emitted in a predetermined direction, above the circuit substrate 2. The light from the lower surface of the LED chip, of lights emitted from the LED chip 8 is reflected on the metal reflective film 6 formed on the semi-spherical concave surface part 4, collected and emitted in the predetermined direction, above the circuit substrate 2.

Light from a side surface of the LED chip 8, of lights emitted from the LED chip 8 is reflected on the metal reflective films formed on the semi-spherical and truncated cone-shape concave surface parts 4 and 5 and is emitted the predetermined direction above circuit substrate 2. In this way, the lights from the upper, side and lower surfaces of the LED chip 8 are directed in the same predetermined direction above the circuit substrate 2 and therefore the lights directed in the predetermined direction are very highly brightened.

As described above, according to the present invention, the light from the lower surface of the LED chip, in particular, of the lights emitted from the LED chip is reflected on the semi-spherical concave surface part, collected, and the reflected and collected light is further reflected and collected on the truncated cone-shape concave surface part and therefore the lights emitted from the LED chip can be used effectively without loss.

Although the preferred embodiments of the present invention have been described, the present invention is not limited to the embodiments, various modifications and changes can be made for the embodiments. For example, the light emitting diode according to the present invention may be structured to have arrangement characteristic of light pursuant to an object of utilization, by forming a semi-spherical concave surface part on the reflective member and a truncated cone-shape concave surface part on the circuit substrate.

What is claimed is:

1. A light emitting diode, comprising:
   a circuit substrate;
   a semi-spherical concave surface part formed in the circuit substrate;
   a transparent stage disposed in the semi-spherical concave surface part in the circuit substrate and including a lower surface having a convex surface corresponding to a concave surface of the semi-spherical concave surface part and an upper surface formed as a horizontal surface;
   a light emitting diode chip mounted on the horizontal upper surface of the transparent stage;
   a reflective member forming a truncated cone-shaped concave surface part which is disposed to be joined to an end of the semi-spherical concave surface part and attached on the circuit substrate; and
   a sealing body disposed in the joined concave surface parts to cover the light emitting diode chip.

2. The light emitting diode according to claim 1, wherein a metal reflective film is provided on an each surface of the semi-spherical concave surface part and the truncated cone-shape concave surface part.

3. The light emitting diode according to claim 2, wherein said metal reflective film is formed by evaporation of silver, aluminum or the like.

4. The light emitting diode according to claim 1, wherein said transparent stage is formed by a transparent resin.

5. The light emitting diode according to claim 1, wherein said sealing body is formed by a transparent resin.

6. The light emitting diode according to claim 1, wherein the LED chip is mounted on the upper surface of the transparent stage at a substantially central position of the semi-spherical concave part.

* * * * *